United States Patent
Li et al.

(10) Patent No.: US 9,443,875 B2
(45) Date of Patent: Sep. 13, 2016

(54) MANUFACTURING METHOD FOR AN ARRAY SUBSTRATE THAT CAN AVOID ELECTRICAL LEAKAGE OF THIN FILM TRANSISTORS

(71) Applicant: BOE TECHNOLOGY GROUP CO., LTD., Beijing (CN)

(72) Inventors: Yanzhao Li, Beijing (CN); Gang Wang, Beijing (CN); Haijing Chen, Beijing (CN); Wulin Shen, Beijing (CN); Jingang Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/422,818

(22) PCT Filed: Apr. 30, 2014

(86) PCT No.: PCT/CN2014/076621
§ 371 (c)(1),
(2) Date: Feb. 20, 2015

(87) PCT Pub. No.: WO2015/100897
PCT Pub. Date: Jul. 9, 2015

(65) Prior Publication Data
US 2016/0035755 A1 Feb. 4, 2016

(30) Foreign Application Priority Data
Dec. 30, 2013 (CN) .......................... 2013 1 0745581

(51) Int. Cl.
*H01L 27/00* (2006.01)
*H01L 27/12* (2006.01)
(Continued)

(52) U.S. Cl.
CPC ......... *H01L 27/1225* (2013.01); *H01L 27/124* (2013.01); *H01L 27/127* (2013.01);
(Continued)

(58) Field of Classification Search
CPC .................... H01L 27/1214; H01L 29/41733; H01L 2924/1306
See application file for complete search history.

(56) References Cited

U.S. PATENT DOCUMENTS

| 6,252,247 B1 | 6/2001 | Sakata et al. |
| 2011/0156028 A1* | 6/2011 | Yamazaki .......... G11C 16/0425 257/43 |
| 2013/0234331 A1* | 9/2013 | Okumoto .............. H01L 27/124 257/744 |

FOREIGN PATENT DOCUMENTS

| CN | 101154346 A | 4/2008 |
| CN | 101272644 A | 9/2008 |

(Continued)

OTHER PUBLICATIONS

Search Report issued in International Application No. PCT/CN2014/076621, dated Apr. 30, 2014.
(Continued)

*Primary Examiner* — Ngan Ngo
(74) *Attorney, Agent, or Firm* — Nath, Goldberg & Meyer; Joshua B. Goldberg; Christopher Thomas

(57) ABSTRACT

The present invention provides array substrate and manufacturing method thereof and display device. The manufacturing method comprises: forming patterns including active regions of first and second TFTs by patterning process on substrate; forming gate insulation layer on the substrate; forming patterns including gates of the TFTs by patterning process on the substrate; forming isolation layer on the substrate; forming, on the substrate, second contacting vias for connecting sources and drains of the TFTs to respective active regions and first contacting via for connecting gate of the second TFT to source of the first TFT; and on the substrate, forming patterns of corresponding sources and drains on the second contacting vias above active regions of the TFTs, and meanwhile forming connection line for connecting gate of the second TFT to source of the first TFT above the first contacting via above gate of the second TFT.

6 Claims, 3 Drawing Sheets

(51) Int. Cl.
*H01L 29/417* (2006.01)
*H01L 27/32* (2006.01)
(52) U.S. Cl.
CPC ....... *H01L27/1214* (2013.01); *H01L 27/1248* (2013.01); *H01L 27/3244* (2013.01); *H01L 29/41733* (2013.01); *H01L 2924/1306* (2013.01)

(56) References Cited

FOREIGN PATENT DOCUMENTS

| CN | 101582424 A | 11/2009 |
|---|---|---|
| CN | 102629621 A | 8/2012 |
| CN | 103700629 A | 4/2014 |

OTHER PUBLICATIONS

Written Opinion of the International Searching Authority dated Apr. 30, 2014 issued in International Application No. PCT/CN2014/076621.

Chinese Office Action dated Oct. 8, 2015 issued in corresponding Chinese Application No. 201310745581.7.

Office Action dated Mar. 25, 2016 issued in corresponding Chinese Application No. 201310745581.7.

* cited by examiner

US 9,443,875 B2

MANUFACTURING METHOD FOR AN ARRAY SUBSTRATE THAT CAN AVOID ELECTRICAL LEAKAGE OF THIN FILM TRANSISTORS

This is a National Phase Application filed under 35 U.S.C. 371 as a national stage of PCT/CN2014/076621 filed on Apr. 30, 2014, an application claiming the benefit to Chinese application No. 201310745581.7 filed on Dec. 30, 2013; the content of each of which is hereby incorporated by reference in its entirety.

FIELD OF THE INVENTION

The present invention relates to the field of manufacturing technology of display devices, and particularly to an array substrate, a manufacturing method thereof and a display device.

BACKGROUND OF THE INVENTION

In a manufacturing process of an AMOLED (active-matrix organic light-emitting diode) array substrate, indium gallium zinc oxide ($InGaZnO_4$; IGZO), an oxide semiconductor, due to its high mobility, good uniformity and capability of being prepared at room temperature, is used as material of an active layer of a thin film transistor, and the thin film transistor generally has a bottom-gate type structure.

FIG. 1 shows the most basic 2T1C pixel structure, which comprises: two thin film transistors (i.e., a first thin film transistor M1 and a second thin film transistor M2) and one storage capacitor C1, and a source of the first thin film transistor M1 is connected to a gate of the second thin film transistor M2.

As shown in FIGS. 2 and 3, in manufacturing an AMOLED array substrate having a 2T1C structure, sources and drains 106 of the first and second thin film transistors M1 and M2 are connected to the respective active regions 103 thereof through second contacting vias 105, respectively, and the gate 102 of the second thin film transistor (driving tube) M2 and the source 106 of the first thin film transistor (switching tube) M1 are connected through a first contacting via 104; by adjusting gate voltage of the second thin film transistor M2 (i.e., source voltage of the first thin film transistor M1), magnitude of current passing through the second thin film transistor M2 can be controlled, and thus a light emission amount from an organic light-emitting layer corresponding to each pixel unit is controlled. However, in the manufacturing process of the above AMOLED device, the technician found that electricity leakage always occurs on an AMOLED backplane (array substrate), which badly affects the yield rate of products.

In an AMOLED display device adopting bottom-gate type TFTs, taking a case that 2T1C is adopted as an example, in one same pixel unit, the first thin film transistor M1 serves as the switching tube, the second thin film transistor M2 serves as the driving tube, and the source of the switching tube and the gate of the driving tube need to be electrically connected through a contacting via. With respect to the problem of electricity leakage occurring on an AMOLED backplane (array substrate) in an existing AMOLED display device, inventors of the present invention have found the followings.

In the manufacturing process of the first contacting via 104 and the second contacting via 105, one exposure and development (Mask-Photo) process is generally used to form patterns of two types of contacting vias on photoresist, and then the two types of contacting vias are formed through one dry etching process. However, in the process of etching, since an etching depth required by the first contacting via 104 is far larger than that of the second contacting via 105, etching time is too long for the second contacting via 105. Long-time dry overetching at the second contacting via 105 may cause the material of the active region 103 and a gate insulation layer provided between the active region 103 and the gate 102 to be further etched until fractured, which causes the source and drain 106 deposited in the subsequent process to be connected to the gate 102 located at the bottom, thus resulting in serious electricity leakage of the backplane. Consequently, the backplane is eventually scrapped and the yield rate is lowered.

Of course, the first contacting via 104 and the second contacting via 105 may be formed through two separate patterning processes, but this method has complex processes and low production efficiency.

SUMMARY OF THE INVENTION

Technical problem to be solved by the present invention includes providing a manufacturing method of an array substrate that can avoid electricity leakage of thin film transistors, an array substrate and a display device, in view of the above defects in the existing array substrate.

A technical solution used to solve the technical problem of the present invention is a manufacturing method of an array substrate, which comprises steps of:

forming, on a substrate, patterns including active regions of a first thin film transistor and a second thin film transistor by a patterning process;

forming, on the substrate subjected to the above step, a gate insulation layer;

forming, on the substrate subjected to the above steps, patterns including gates of the first thin film transistor and the second thin film transistor by a patterning process;

forming, on the substrate subjected to the above steps, an isolation layer;

forming, on the substrate subjected to the above steps, second contacting vias, which are used for electrically connecting sources and drains of the first thin film transistor and the second thin film transistor to the respective active regions, and a first contacting via, which is used for electrically connecting the gate of the second thin film transistor to the source of the first thin film transistor and provided above the gate of the second thin film transistor; and on the substrate subjected to the above steps, forming patterns of corresponding sources and drains on the second contacting vias above the active regions of the first thin film transistor and the second thin film transistor by a patterning process, and forming, above the first contacting via above the gate of the second thin film transistor, a connection line for connecting the gate of the second thin film transistor to the source of the first thin film transistor at the same time.

In the manufacturing method of an array substrate of the present invention, active regions are first formed, then gates are formed, and therefore, the gates are located above the active regions. In this way, when forming the second contacting via, the gate metal serves as the bearing body against etching, and since the gate metal has stronger capacity of resisting etching than material of the active region, it can avoid the problem that the gate metal provided below the second contacting via is etched through due to relatively long etching time for the second contacting via when forming the first contacting vias and second contacting via simultaneously, and thus electricity leakage occurs on the array substrate.

Preferably, before the step of forming, on a substrate, patterns including active regions of a first thin film transistor and a second thin film transistor by a patterning process, the method further comprises a step of:

forming a buffer layer on the substrate.

Further preferably, the buffer layer is made of silicon oxide or silicon nitride, and has a thickness between 5 nm and 500 nm.

Further preferably, the sources and drains of all the thin film transistors and the connection line are made of any one of molybdenum, copper and aluminum, and each have a thickness between 1 nm and 500 nm.

Preferably, the active regions of all the thin film transistors are made of any one of indium gallium zinc oxide, indium zinc oxide, indium tin oxide, indium gallium tin oxide, amorphous silicon and polycrystalline silicon, and have a thickness between 5 nm to 200 nm.

Preferably, the gates of all the thin film transistors are made of any one of molybdenum, copper and aluminum.

A technical solution to solve the technical problem of the present invention is an array substrate, which is manufactured by using any one of the above manufacturing methods.

Preferably, the array substrate is an OLED array substrate, the first thin film transistor is a switching tube and the second thin film transistor is a driving tube.

A technical solution to solve the technical problem of the present invention is a display device, which comprises the above array substrate.

Figure 1:
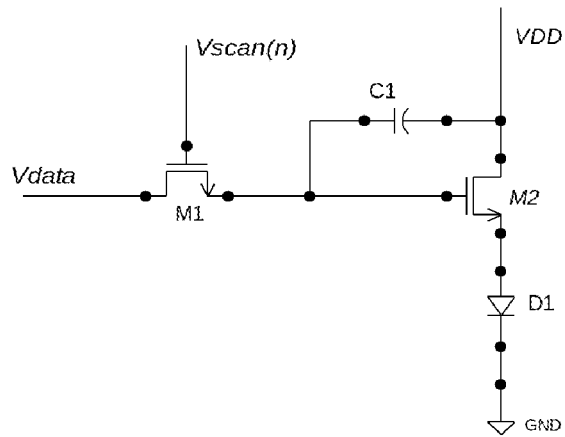
FIG. 1 is a schematic diagram of a circuit of an existing 2T1C pixel structure.
Figure 2:
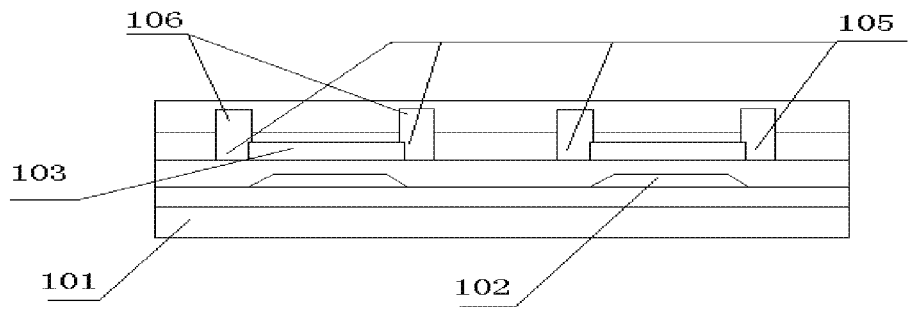
FIG. 2 is a schematic diagram of a structure of one side of an existing array substrate.

Reference numerals: 101, substrate; 102, gate; 103, active region; 104, first contacting via; 105, second contacting via; 106, source/drain; 107, buffer layer; 108, gate insulation layer; 109, connection line; 110, planarization layer; 111, passivation layer; M1, first thin film transistor; M2, second thin film transistor.

DETAILED DESCRIPTION OF THE EMBODIMENTS

To enable those skilled in the art to better understand the technical solutions of the present invention, the present invention will be further described below in detail in conjunction with the accompanying drawings and the specific implementations.

Embodiment 1

Figure 4:
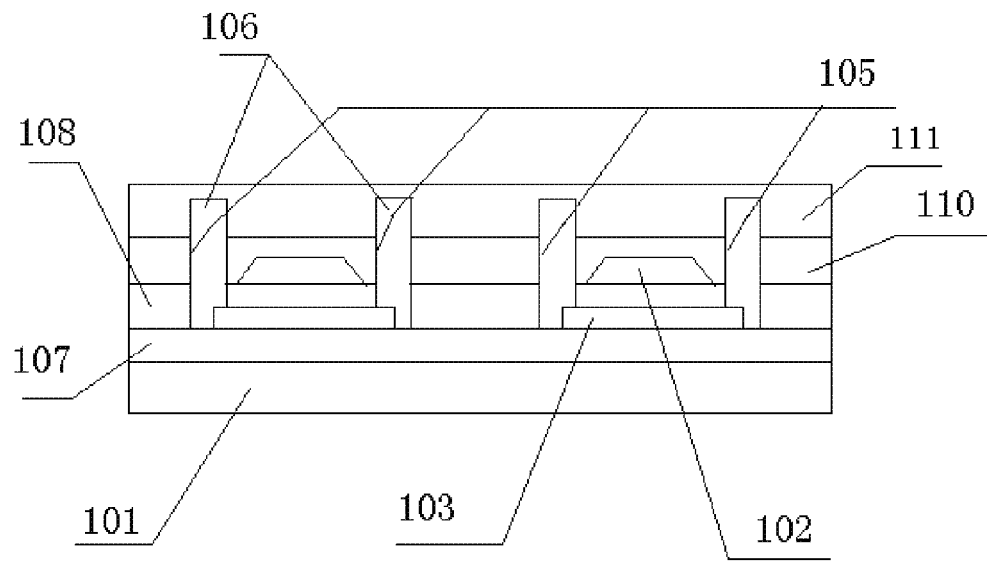
FIG. 4 is a schematic diagram of a structure of one side of an array substrate manufactured by using a manufacturing method of an array substrate provided by Embodiment 1 of the present invention.
Figure 5:
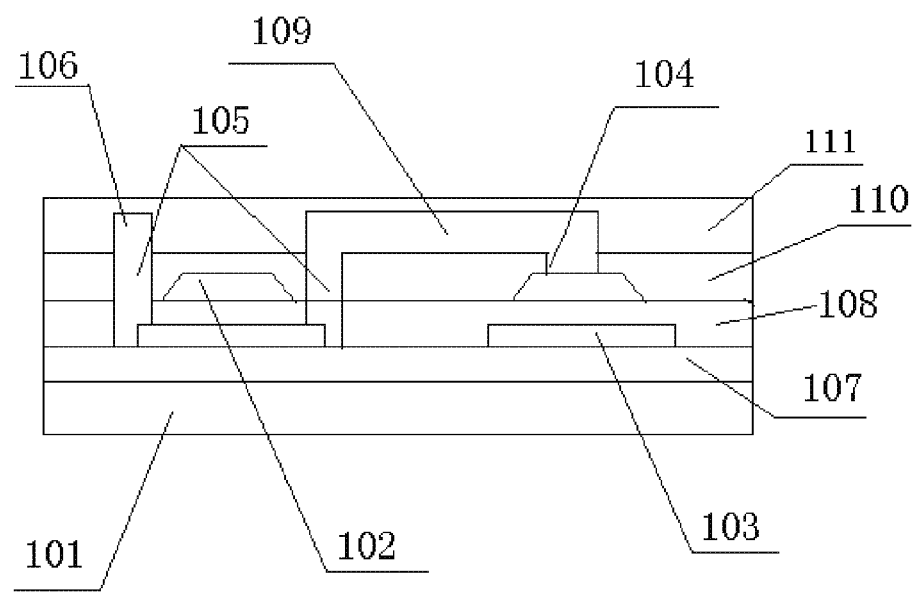
FIG. 5 is a schematic diagram of a structure of another side of the array substrate manufactured by using the manufacturing method of an array substrate provided by Embodiment 1 of the present invention.
Figure 6:
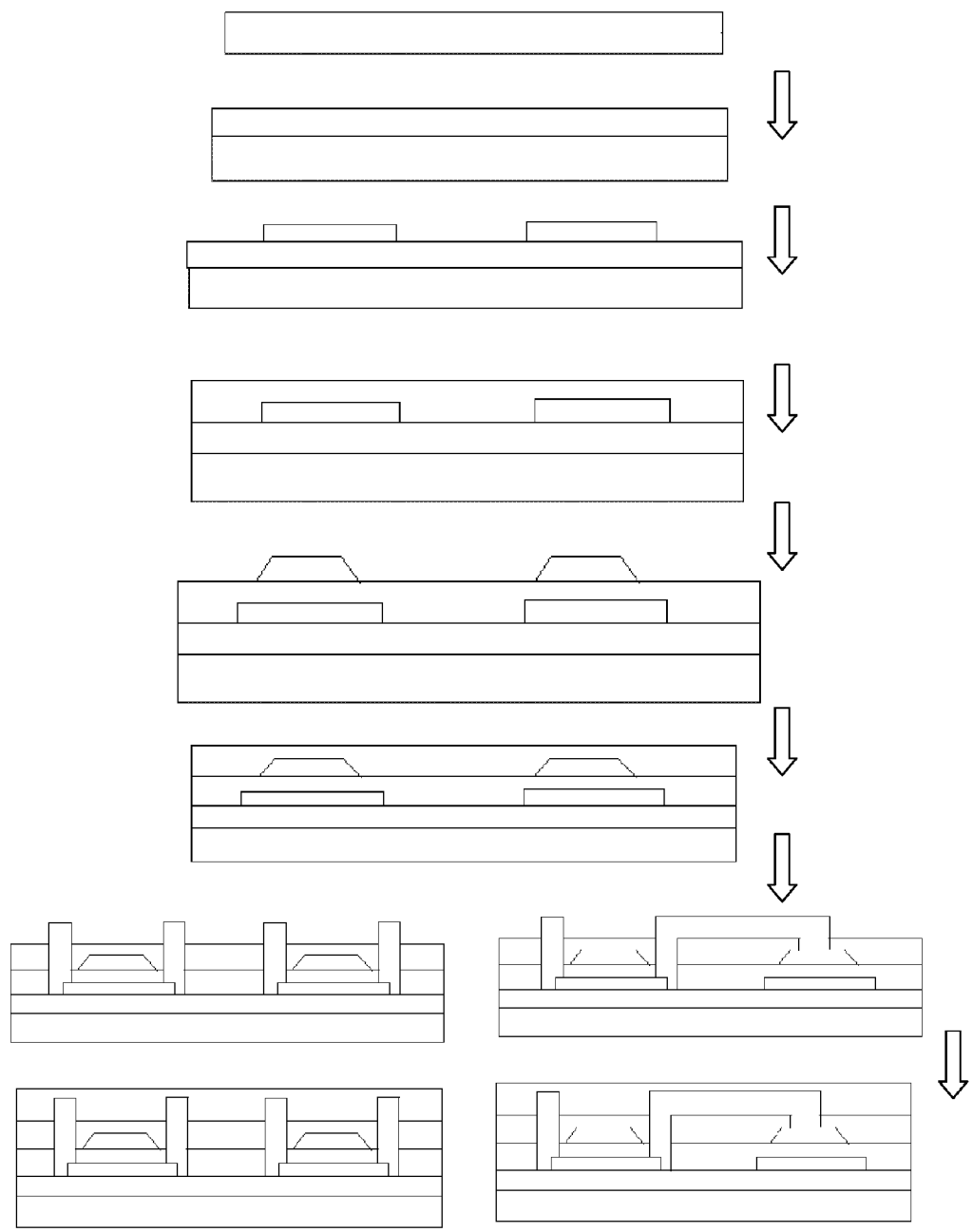
FIG. 6 is a schematic diagram illustrating processes of the manufacturing method of an array substrate provided by Embodiment 1 of the present invention.

A manufacturing method of an array substrate provided by the present embodiment will be described in conjunction with FIGS. 4 to 6, and the manufacturing method specifically comprises steps as follows.

At step 1, a buffer layer 107 is deposited on a substrate 101 by using a sputtering method. Material of the buffer layer 107 may be silicon oxide, silicon nitride or organic insulation material; the buffer layer 107 preferably has a thickness between 5 nm and 500 nm.

At step 2, on the substrate with the buffer layer 107 formed thereon, patterns including active regions 103 of a first thin film transistor and a second thin film transistor are formed by a patterning process.

Specifically, a buffer layer film may be deposited by using magnetron sputtering, then annealed at 300° C. for one hour in air atmosphere, and subsequently, patterns of the required active regions 103 are formed by a patterning process. Material of the active regions may adopt any one of indium gallium zinc oxide (IGZO), indium zinc oxide (IZO), indium tin oxide (ITO), indium gallium tin oxide (InGaSnO), amorphous silicon, polycrystalline silicon and the like, and may also be other semiconductor material; the active regions preferably have a thickness between 5 nm to 200 nm.

At step 3, a gate insulation layer 108, which covers the active regions 103 of the thin film transistors, is formed on the substrate with the active regions 103 of the first thin film transistor and the second thin film transistor formed thereon. Preferably, material of the gate insulation layer 108 is an insulation material, such as silicon oxide, silicon nitride, organic insulation material or the like; the gate insulation layer 108 preferably has a thickness between 1 nm and 300 nm.

At step 4, on the substrate with the gate insulation layer 108 formed thereon, patterns including gates 102 of the first and second thin film transistors are formed by a patterning process. Material of the gates 102 may be any one of molybdenum (Mo), copper (Cu) and aluminum (Al), and of course may be other metal material, alloy material or composite conductive material; the gates 102 preferably have a thickness between 1 nm and 300 nm.

At step 5, a planarization layer 110 (electrically insulated) is formed on the substrate with the gates 102 of the first and second thin film transistors formed thereon. Material of the planarization layer 110 may be silicon oxide or silicon nitride, and of course may be other insulation material; the planarization layer 110 preferably has a thickness between 5 nm and 500 nm.

At step 6, second contacting vias 105 for electrically connecting the source and drain 106 of the first thin film transistor and the source and drain 106 of the second thin film transistor to their respective active regions 103, and the first contacting via 104 for electrically connecting the gate 102 of the second thin film transistor to the source 106 of the first thin film transistor are formed by one patterning process.

At step 7, patterns of corresponding sources and drains 106 are formed on the second contacting vias 105 above the active regions 103 of the first thin film transistor and the second thin film transistor by a patterning process, and meanwhile a metal connection line 109 for connecting the gate 102 of the second thin film transistor to the source 106 of the first thin film transistor is formed above the first contacting via 104 above the gate 102 of the second thin film transistor. Here, materials of the sources and drains 106 of the two thin film transistors and the connection line 109 may adopt any one of molybdenum (Mo), copper (Cu) and aluminum (Al), and of course may be other metal material, alloy material or composite conductive material; the sources and drains 106 of the two thin film transistors and the connection line 109 preferably have a thickness between 1 nm and 500 nm.

In the present embodiment, since the depth of the first contacting via 104 is smaller than that of the second contacting via 105, for the first contacting via 104, its etching time is relatively long. However, the bearing body against etching when forming the first contacting via 104 is the gate 102, the metal material adopted by the gate 102 has a relatively large thickness, and therefore, the gate has much stronger capacity of resisting etching than the material of the active region 103. As a result, when forming the first contacting via 104 and the second contacting vias 105 at the same time, a case that the gate 102 and the gate insulation layer 108 provided below the gate 102 are etched through due to the same etching time, resulting in that the gate 102 is connected with the active region and even with the source and drain 106, and thus electricity leakage occurs on the array substrate can be avoided, and therefore, the yield rate of products can be improved.

At step 8, a passivation layer 111 is formed on the substrate 101 subjected to the above steps. Material of the passivation layer 111 may be silicon oxide or silicon nitride; the passivation layer 111 preferably has a thickness between 5 nm and 500 nm. Thus, the array substrate shown in FIGS. 4 and 5 are finally obtained.

In the array substrate manufactured through the above steps, the gates are provided between the active regions and the sources/drains, and therefore, when forming the first contacting via 104 and the second contacting vias 105, metals of the gates 102 serve as the bearing bodies against long-time etching. Thus, the manufactured array substrate has greatly improved resistance to electricity leakage.

Of course, only the manufacturing of two thin film transistors in the array substrate are specifically described in the present embodiment, and pixel structure of the array substrate may be 2T1C type. Similarly, the present embodiment is also applicable to a manufacturing method of a thin film transistor in a 6T2C type pixel circuit, a timing control circuit, a scan driving circuit, a data driving circuit, a backplane testing circuit, a static electricity preventing circuit, or other functional circuit of a TFT backplane, and the manufacturing principle thereof is the same as the above method and is not repeated therein. All array substrates having the first contacting via 104 and the second contacting vias 105 of the thin film transistors manufactured by using the above method fall into the protection scope of the present invention.

In the present embodiment, the source and the drain of the thin film transistor are the same in structure, and therefore they are exchangeable in function. In the description of Embodiment 1, the drain serves as a signal input terminal and the source serves as a signal output terminal; however, the protection scope of the present invention is not limited thereto, and a solution in which the source serves as a signal input terminal of a TFT and the drain serves as a signal output terminal also falls in the protection scope of the present invention.

Embodiment 2

Figure 3:
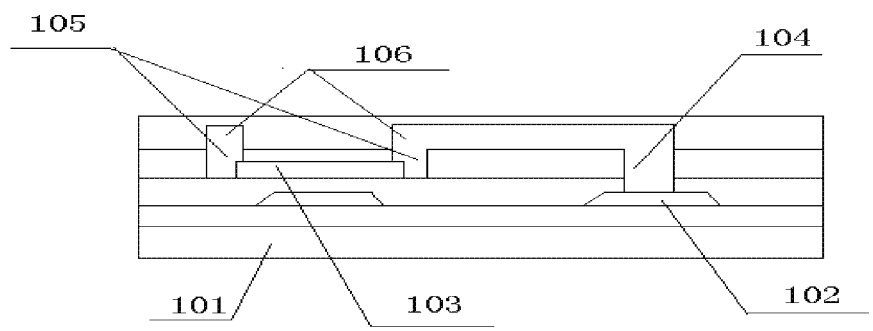
FIG. 3 is a schematic diagram of a structure of another side of the existing array substrate.

As shown in FIG. 3, the present embodiment provides an array substrate comprising a plurality of pixel units, each of which comprises a first thin film transistor and a second thin film transistor, a gate 102 of the second thin film transistor is connected to a source 106 of the first thin film transistor through a first contacting via 104, and the array substrate is manufactured by using the manufacturing method described in Embodiment 1.

Specifically, the array substrate comprises: active regions 103 of the first and second thin film transistors formed above a buffer layer 107; a gate insulation layer 108 of the first and second thin film transistors formed above the active regions 103; gates 102 of the first and second thin film transistors formed above the gate insulation layer 108 and respectively corresponding to the respective active regions 103; a planarization layer 110 formed above the gates 102; sources and drains 106 of the first and second thin film transistors penetrating through the planarization layer 110 and the gate insulation layer 108 and connected to the respective active regions 103; and a connection line 109 penetrating through the planarization layer 110 to be connected to the gate 102 of the second thin film transistor and extending on the planarization layer 110 to be connected to the source 106 of the first thin film transistor.

Preferably, the array substrate is an OLED array substrate, the first thin film transistor is a switching tube, the second thin film transistor is a driving tube, and the source 106 of the switching tube is connected with the gate 102 of the driving tube.

Of course, the array substrate should further comprise data lines, scan lines and other known structures, which are not described in detail herein.

The array substrate of the present embodiment is manufactured by using the method of Embodiment 1, and therefore, the yield rate of the array substrate is greatly improved.

In the present embodiment, the source of a TFT may function as a signal input terminal of the TFT, and the drain thereof may function as a signal output terminal. In this case, the source of the switching tube is connected to a data line so as to receive an image data signal, while the drain of the switching tube is connected to the gate of the driving tube so as to control magnitude of current passing through the driving tube.

Embodiment 3

The present embodiment provides a display device comprising the array substrate described in Embodiment 2, and the display device may be any product or component with display function, such as an OLED panel, a mobile phone, a tablet computer, a television, a display, a notebook computer, a digital photo frame, a navigator or the like.

The display device of the present embodiment comprises the array substrate in Embodiment 1, and thus the yield rate thereof is greatly improved.

Of course, the display device of the present embodiment also comprises other conventional structures, such as a power unit, a display driving unit and the like, which are not described in detail herein.

It can be understood that, the above implementations are merely exemplary implementations for explaining the principle of the present invention, but the present invention is not limited thereto. For those skilled in the art, various variations and improvements may be made without departing from the spirit and essence of the present invention, and these variations and improvements are also deemed as the protection scope of the present invention.

The invention claimed is:

1. A manufacturing method of an array substrate, comprising steps of:

forming, on a substrate, patterns including active regions of a first thin film transistor and a second thin film transistor by a patterning process;

forming, on the substrate subjected to the above step, a gate insulation layer;

forming, on the substrate subjected to the above steps, patterns including gates of the first thin film transistor and the second thin film transistor by a patterning process;

forming, on the substrate subjected to the above steps, an isolation layer;

forming, on the substrate subjected to the above steps, second contacting vias, which are used for electrically connecting sources and drains of the first thin film transistor and the second thin film transistor to the respective active regions, and a first contacting via, which is used for electrically connecting the gate of the second thin film transistor to the source of the first thin film transistor and is provided above the gate of the second thin film transistor; and on the substrate subjected to the above steps, forming patterns of corresponding sources and drains on the second contacting vias above the active regions of the first thin film transistor and the second thin film transistor by a patterning process, and forming, above the first contacting via above the gate of the second thin film transistor, a connection line for connecting the gate of the second thin film transistor to the source of the first thin film transistor at the same time.

2. The manufacturing method of an array substrate according to claim 1, further comprising, before the step of forming, on a substrate, patterns including active regions of a first thin film transistor and a second thin film transistor by a patterning process, a step of:

forming a buffer layer on the substrate.

3. The manufacturing method of an array substrate according to claim 2, wherein, the buffer layer is made of silicon oxide or silicon nitride, and has a thickness between 5 nm and 500 nm.

4. The manufacturing method of an array substrate according to claim 1, wherein, the sources and drains of all the thin film transistors and the connection line are made of any one of molybdenum, copper and aluminium; and the sources and drains of all the thin film transistors and the connection line each have a thickness between 1 nm and 500 nm.

5. The manufacturing method of an array substrate according to claim 1, wherein, the active regions of all the thin film transistors are made of any one of indium gallium zinc oxide, indium zinc oxide, indium tin oxide, indium gallium tin oxide, amorphous silicon and polycrystalline silicon; the active regions have a thickness between 5 nm to 200 nm.

6. The manufacturing method of an array substrate according to claim 1, wherein, the gates of all the thin film transistors are made of any one of molybdenum, copper and aluminium.

* * * * *